(12) United States Patent  
Lof et al.

(10) Patent No.: US 7,057,702 B2  
(45) Date of Patent: Jun. 6, 2006

(54) LITHOGRAPHIC APPARATUS AND DEVICE MANUFACTURING METHOD

(75) Inventors: Joeri Lof, Eindhoven (NL); Johannes Catharinus Hubertus Mulkens, Waalre (NL); Jeroen Johannes Sophia Maria Mertens, Duizel (NL); Antonius Johannes Van Der Net, Tilburg (NL); Ronald Van Der Ham, Maarheeze (NL); Nicolas Lallemant, Veldhoven (NL); Marcel Beckers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 149 days.

(21) Appl. No.: 10/873,650

(22) Filed: Jun. 23, 2004

(65) Prior Publication Data

US 2005/0286032 A1  Dec. 29, 2005

(51) Int. Cl.  
*G03B 27/52* (2006.01)

(52) U.S. Cl. .................................................... 355/30
(58) Field of Classification Search ................... 355/30  
See application file for complete search history.

(56) References Cited

U.S. PATENT DOCUMENTS

| | | | |
|---|---|---|---|
| 4,480,910 A * | 11/1984 | Takanashi et al. | ............. 355/30 |
| 5,900,354 A * | 5/1999 | Batchelder | ................... 430/395 |
| 6,700,641 B1 * | 3/2004 | Shiraishi | ....................... 355/30 |
| 6,788,477 B1 * | 9/2004 | Lin | ............................. 359/820 |

* cited by examiner

*Primary Examiner*—Michael Tokar  
*Assistant Examiner*—Vivian Nelson  
(74) *Attorney, Agent, or Firm*—Pillsbury Winthrop Shaw Pittman LLP

(57) ABSTRACT

A lithographic projection apparatus is disclosed. The apparatus includes an illumination system configured to condition a beam of radiation, and a support structure configured to support a patterning device. The patterning device serves to impart the beam of radiation with a pattern in its cross-section. The apparatus also includes a substrate table configured to hold a substrate, a projection system configured to project the patterned beam onto a target portion of the substrate, and a fluid supply system configured to provide a fluid to a volume. The volume includes at least a portion of the projection system and/or at least a portion of the illumination system. The apparatus further includes a coupling device configured to couple the fluid supply system to the substrate table, substrate, support structure, patterning device, or any combination thereof.

40 Claims, 6 Drawing Sheets

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

Radiation used to irradiate the substrate in combination with contaminants—which may be introduced by, for example, outgassing of the photoresist layer on the substrate and also by ambient air entering the lithographic apparatus—may cause optical components in the projection system, for example, lenses, to degrade, which causes loss of overall transmission of the beam and loss of substrate illumination uniformity.

To address this problem, purging systems have been developed. The function of a purging system, for example, a purge hood, is to prevent or reduce chemical contamination of certain elements of the projection system and/or the illumination system. This may typically be done by blowing gas along an outer surface or surfaces of the elements in the projection system, so that the concentration of unwanted agents is diluted at the exposure slit by a factor of, for example, greater than typically 1000. However, dilution factors may vary between 100 to 10000 depending on, for example, the type of lithographic apparatus, the system specifications and the gas quality, etc.

In a purged system, while the internal elements in the projection system and the illumination system may be purged satisfactorily, since they are disposed in enclosed compartments, degradation continues to be a problem caused by the occurrence of contamination on, in particular, the surfaces of the first and last optical elements in the projection system, that is the first optical element encountered by the projection beam and the last optical element encountered by the projection beam as it passes through the projection system. Contamination of optical elements that may lead to the degradation of optical element performance includes, for example, dendritic salt structures which grow on the optical element surfaces. For example, optical elements subject to intense radiation over a period of time, typically a few years, become contaminated with salt structures. Thus, conventional purge hoods are typically positioned to provide cleaning gas along the surface of the outer bottom and top lens surfaces. Conventional purge hoods are mounted at a fixed position, for example, fixed to the projection system or a reference frame, such as the metrology frame. As mentioned, performance of the purge hood is typically expressed as a dilution factor, that is the ratio of the contaminants inside and outside the purged volume, and is conventionally of an order of 1000.

Conventional purge hoods, however, may suffer drawbacks. In particular, the performance of the purge hood may be negatively influenced by a gap between the purge hood and the substrate and/or between the purge hood and the substrate holder. As a result, the performance of the purge hood is dependent on the position of the substrate holder and is also influenced by gas showers provided to condition interferometric measurement components in the lithographic apparatus. For example, when no substrate holder is present, for example, when the substrate is being changed, the performance measured by the dilution may be poor. Further, dynamical disturbances, for example, flow induced vibrations, caused by the purge hood may affect the performance of the projection system. Conventional dilution factors may not be sufficient to reduce the moisture level at the optical element surface to well below 10 parts per million (ppm), which corresponds to less than one monolayer, which has been found to help prevent the formation of salt structures.

Further, a small gap between the substrate and the purge hood may not be satisfactorily achieved because of tolerances between the substrate table and the projection system. A similar situation may also be encountered in an immersion lithography apparatus, in which a small gap is to be maintained between a liquid supply system and the substrate, with at least part of the gap being filled with a liquid. In addition, the substrate table may move upward when servo control is lost, thus damaging the substrate when the gap between the substrate and the purge hood, or the liquid supply system is small.

Similar problems may arise between the illuminator and the support structure.

SUMMARY

It is an aspect of the present invention to address, for example, those problems encountered with conventional purge hoods, or immersion lithography liquid supply systems within the very limited space available in the lithographic apparatus.

According to an aspect of the invention, there is provided a lithographic apparatus that includes an illumination system configured to condition a beam of radiation, and a support structure configured to support a patterning device. The patterning device serves to impart the beam of radiation with a pattern in its cross-section. The apparatus also includes a substrate table configured to hold a substrate, a projection system configured to project the patterned beam onto a target portion of the substrate, and a fluid supply system configured to provide a fluid to a volume. The volume includes at least a portion of the projection system and/or at least a portion of the illumination system. The apparatus further includes a coupling device configured to couple the fluid supply system to the substrate table, substrate, support structure, patterning device, or any combination thereof. In this way, disturbances in at least one of the projection system and illumination system arising from flow induced noise are reduced.

In an embodiment, the fluid supply system includes a gas purging system configured to provide a gas to a purge volume, the purge volume including at least a portion of the projection system, at least a portion of the illumination system, or both. In this way, disturbances caused by flow induced noise in the gas purging system may be reduced.

In an embodiment, the fluid supply system includes a liquid supply system configured to provide a liquid to a space between the projection system and a localized area of the substrate. In this way, disturbances caused by flow induced noise in the liquid supply system may be reduced.

In an embodiment, the substrate table, substrate, support structure, patterning device, or any combination thereof is disposed in a zone defined by a first and second different direction, and wherein the fluid supply system is coupled to the substrate table, substrate, support structure, patterning device, or any combination thereof in a third direction, which extends at an angle to the zone.

Further, the first, second and third directions are substantially mutually perpendicular. In a further embodiment, the fluid supply system, in use, is flexibly coupled to the substrate table, the substrate, support structure, the patterning device, or any combination thereof in the third direction, a rotational direction around the first direction, and a rotational direction around the second direction. In this way, the fluid supply system may be arranged to follow the substrate and/or patterning device movement in the third direction. Further, protection may be provided to prevent collision between the substrate table, the substrate, the support structure, the patterning device, or any combination thereof, and the fluid supply system.

In an embodiment, the fluid supply system, in use, is rigidly coupled to the projection system, the illumination system, a reference frame, or any combination thereof in the first direction, the second direction, and a rotational direction around the third direction. In this way, the fluid supply system may be securely mounted while reducing disturbances to the projection system, the illumination system, or both, yet permitting a degree of flexibility in the third direction.

In an embodiment, the coupling device includes a gas bearing. In this way, a stable gap may be achieved between the fluid supply system and the substrate table, the substrate, the support structure, the patterning device, or any combination thereof without requiring high tolerances. Further, the gas bearing may allow the fluid supply system to be positioned very close to the substrate table, the substrate, the support structure, the patterning device, or any combination thereof without risking collision, thus providing more space in other regions of the lithographic apparatus, for example, around the projection system and the illumination system.

In an embodiment, the gas bearing is configured to provide a seal to prevent fluid from escaping from the fluid supply system or alternatively, to prevent ambient gas from entering the fluid supply system. In this way, a minimal gap between the fluid supply system and the substrate, substrate table, support structure, patterning device, or any combination thereof may be achieved, thus providing an improved dilution factor, for example, a dilution factor of greater than 10000.

Further, in the case of the fluid supply system including a gas purging system, a seal ensures that there may be no disturbance within the volume by gas showers. Further, the seal may allow a closing plate to be used to increase dilution factor during substrate table exchange. High dilution factors may keep moisture away from the projection system and illumination system optical elements to a sufficiently low level in a conventional "dry" lithographic system, for example, a few parts per million (ppm). This may improve the effectiveness of the purging system in such a lithographic system.

In an embodiment, the gas bearing is configured to provide a substantially enclosed fluid compartment. In this way, the dilution factor may be further improved.

In an embodiment, the substrate table, the support structure, or both is provided with a recess configured to receive the substrate and patterning device, respectively. Further, the recess may have a depth substantially equal to the thickness of at least one of the substrate and patterning device, respectively. Further, in use, a surface of the substrate arranged to receive the patterned beam is substantially flush with a surface of the substrate table. In this way, during scanning, the fluid supply system may be able to move equally well over the substrate table as well as the substrate without any adjustments to the coupling device having to be made. Further, in use, a surface of the patterning device arranged to receive the beam of radiation is substantially flush with a surface of the support structure. In this way, during exposure of the patterning device, the fluid supply system may be able to move over the support structure as well as the patterning device without any adjustments to the coupling device having to be made.

In an embodiment, the gas bearing, in use, provides at least one of a stable and small gap between a surface of the substrate arranged to receive the patterned beam and the fluid supply system. In this way, the chances of collision between the fluid supply system and, in particular, the substrate, may be improved. By providing a small and stable gap, effective fluid supply may be made easier.

In an embodiment, the gas bearing, in use, provides at least one of a stable gap between a surface of the patterning device arranged to receive the beam of radiation and the fluid supply system. In this way, the chances of collision between the fluid supply system and, in particular, the patterning device, may be improved. By providing a small and stable gap, effective fluid supply may be made easier.

In an embodiment, the gas bearing includes a control element configured to regulate the flow and/or pressure of gas, to control the dimension of a gap between a surface of the substrate arranged to receive the projection beam and the fluid supply system. In this way, the chances of collision between the fluid supply system and, in particular, the substrate, may be improved, i.e. reduced.

In an embodiment, the gas bearing includes a control element configured to regulate the flow and/or pressure of gas, to control the dimension of a gap between a surface of the patterning device arranged to receive the beam of radiation and the fluid supply system. In this way, the chances of collision between the fluid supply system and, in particular, the patterning device, may be improved, i.e. reduced.

In an embodiment, the gas bearing includes a gas supply configured to supply gas to the gas bearing, at least a partial vacuum configured to remove gas from the gas bearing, and a control element which is configured to control the gas supply and the at least partial vacuum in conjunction, so that the fluid supply system floats on a surface of the substrate, the substrate table, or both with sufficient stiffness in a third direction lying at an angle to the zone defined by a first and second direction in which the substrate table is disposed. In this way, a stable coupling may be provided between the fluid supply system and the substrate table, substrate, or both without requiring substantial adjustment and without substantially adding complexity to the apparatus.

In an embodiment, the gas bearing includes a gas supply configured to supply gas to the gas bearing, at least a partial vacuum configured to remove gas from the gas bearing and a control element which is configured to control the gas supply and the at least partial vacuum in conjunction, so that the purging system floats on a surface of at least the patterning device and the support structure with sufficient stiffness in a third direction lying at an angle to the zone defined by a first and second direction in which the support structure is disposed. In this way, a stable coupling may be provided between the fluid supply system and the support structure, patterning device, or both without requiring substantial adjustment and without substantially adding complexity to the apparatus.

In an embodiment, the purging system includes a purge hood, and the gas bearing includes an actuator configured to lift the purge hood in a third direction, wherein the third direction extends in a direction at an angle to a zone in which the substrate table, the support structure, or both is disposed. In this way, the purge hood may be conveniently lifted when required, for example, when a substrate table or substrate exchange takes place.

In an embodiment, the purging system includes a purge hood, and the apparatus further includes an actuator arranged in conjunction with the coupling device, to cause the purge hood to be lifted in a third direction, wherein the third direction extends in a direction at an angle to a zone in which the substrate table, the support structure, or both is disposed. In this way, the purge hood may be conveniently lifted without adding substantial complexity to the apparatus. In an embodiment, the actuator causes a magnet to lift the purge hood.

In an embodiment, the first, second and third directions correspond to an X, Y and Z, direction respectively. Further, the Y direction may be a scanning direction, the X direction and Y direction may define a plane in which the substrate table, the substrate, or both are disposed, in use, and the Z direction may extend in a direction substantially perpendicular to the plane.

In an embodiment, the purging system includes a purge hood, wherein the coupling device is configured to couple the purging hood with respect to the substrate table or the support structure, so that a movement of the substrate table and substrate, or support structure and patterning device, respectively, in a third direction, which lies at an angle to the zone in which the substrate table and support structure are disposed, respectively, is followed by the purge hood. In this way, collision may be avoided.

In an embodiment, the gas bearing includes a gas outlet by which pressurized gas can be provided to a coupling region. In this way, a sufficient coupling may be achieved.

In an embodiment, the gas bearing includes a partial vacuum by which the pressurized gas can be removed from the coupling region. In this way, the coupling may be improved.

In an embodiment, the coupling device includes a gas bearing and a control element is provided, to provide a minimal gas gap between the substrate table, the substrate, the support structure, the patterning device, or any combination thereof and the purging system, so as to isolate the purge volume from a surrounding environment. In this way, contamination of the purge volume from the surrounding environment and contamination of the surrounding environment from the purge volume may be reduced or prevented.

In an embodiment, the liquid supply system includes a seal member configured to at least reduce leakage of the liquid from under the projection system. In an embodiment, the seal member is coupled to the substrate table, substrate, support structure, patterning device, or any combination thereof.

According to a second aspect of the present invention, there is provided a device manufacturing method that includes projecting a patterned beam of radiation onto a target portion of a substrate using a projection system of a lithographic apparatus; and providing a fluid to a volume using a fluid supply system. The volume includes at least a portion of the projection system, at least a portion of a illumination system, or both. The method also includes coupling the fluid supply system to the substrate, a substrate table holding the substrate, a patterning device used to form the patterned beam, a support structure holding the patterning device, or any combination thereof.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
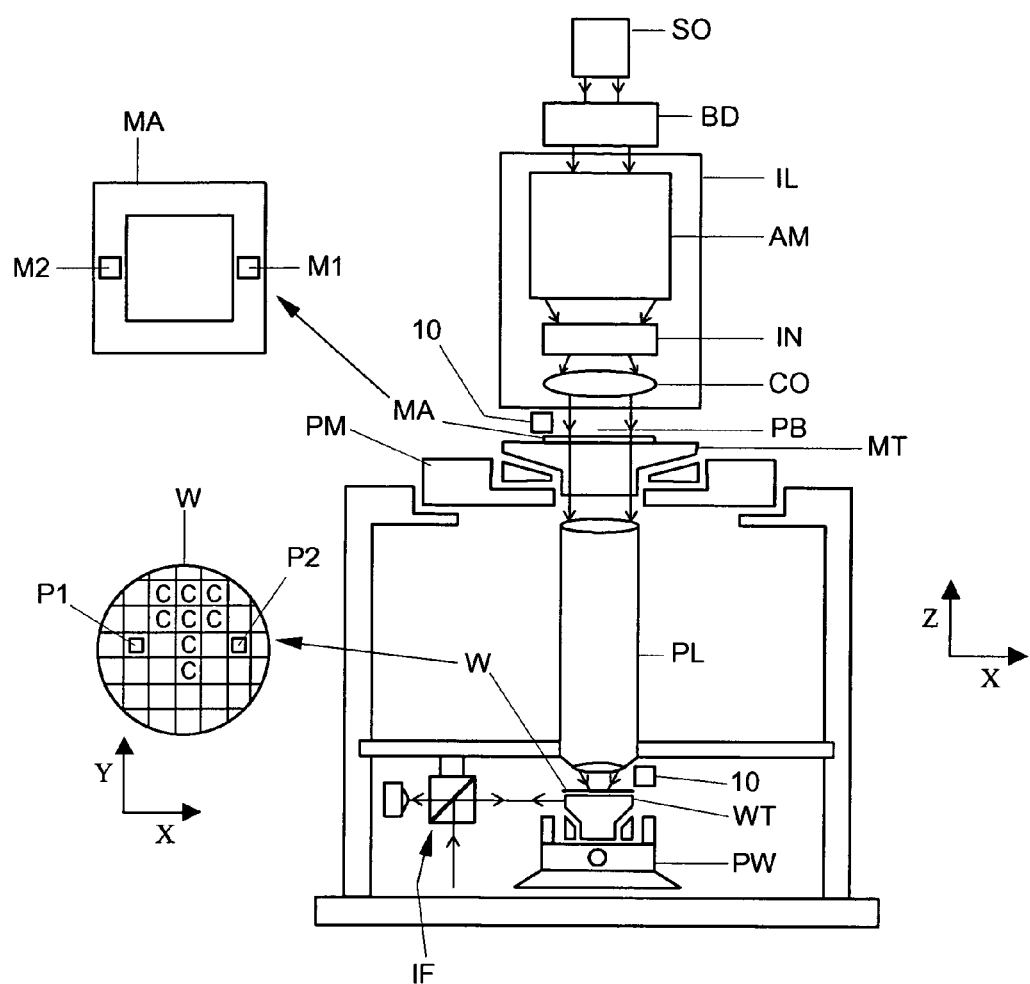
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV radiation or EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a refractive projection lens) PL for imaging a pattern imparted to the projection beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases, the source may be integral part of the apparatus, for example when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross section.

The projection beam PB is incident on the mask MA, which is held on the mask table MT. Having traversed the mask MA, the projection beam PB passes through the system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed. Also shown in FIG. 1 is a fluid supply system, for example, a gas purging system 10 or a liquid supply system described in further detail with reference to FIGS. 2–8. One or more embodiments of the present invention are described hereinbelow in particular with reference to a conventional "dry" lithography apparatus including a gas purging system 10. However, one or more embodiments of the invention are equally well applicable to an immersion lithography apparatus that includes a liquid supply system. In particular, the liquid supply system may include a seal member configured to at least partially contain liquid between a final element of the projection system and a substrate. Further, the seal member may be coupled to the substrate table, substrate, support structure, patterning device or any combination thereof.

Figure 2:
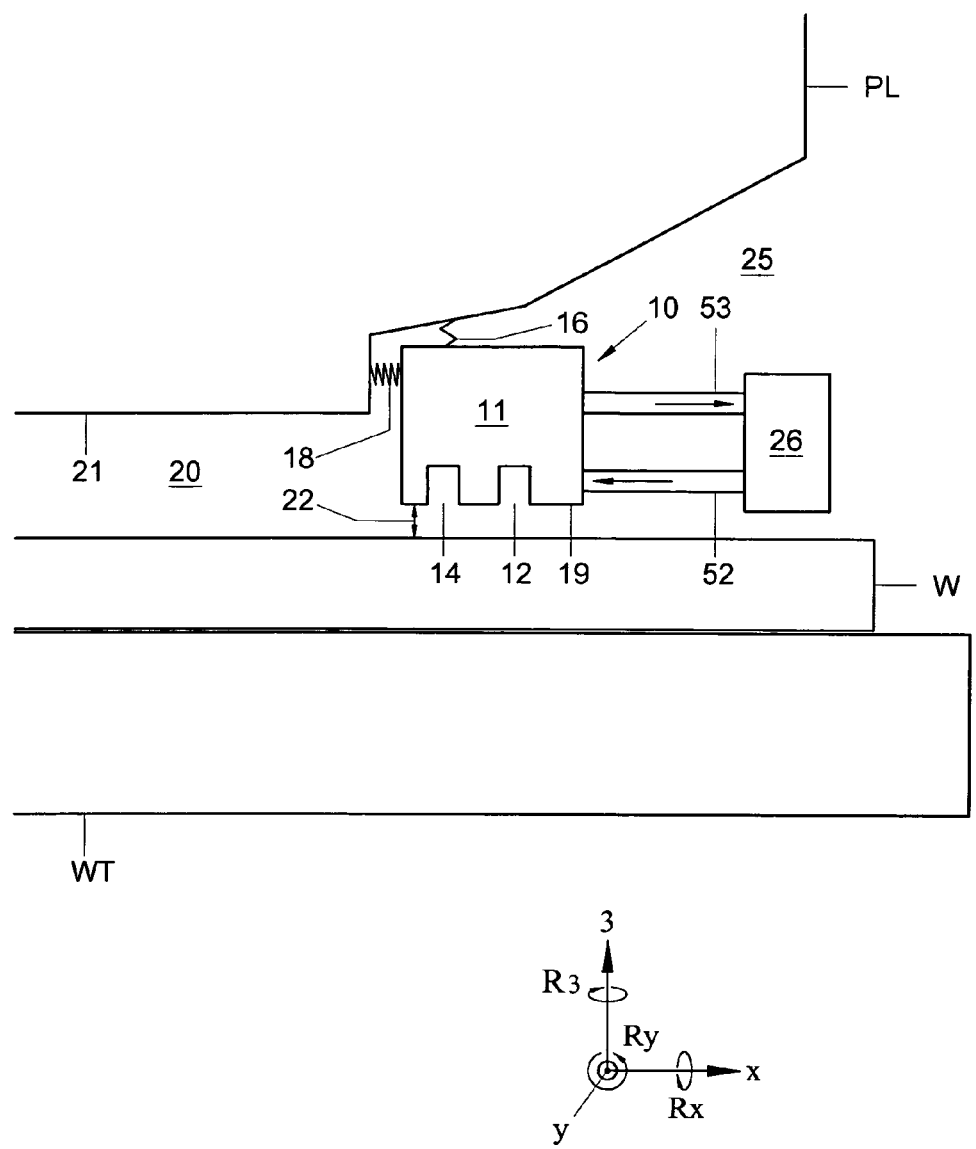
FIG. 2 depicts a lithographic apparatus that includes a gas purging system according to an embodiment of the invention.

FIG. 2 depicts a lithographic apparatus that includes a gas purging system 10 according to an embodiment of the invention. In particular, FIG. 2 shows the purging system 10 as including a purge hood 11. The purging system 10 is arranged to provide a substantially laminar purge flow of a gas within a purge volume 20. The purging system 10, in particular, the purge hood 11 is coupled rigidly to the projection system PL by a rigid coupling device 18, so that movement of the purge hood 11 relative to the projection system PL is typically limited in the X, Y and Rz directions. In an alternative embodiment, the purge hood 11 may be rigidly connected to another component in the lithographic apparatus, such as a reference or metrology frame (not shown). The Z direction is shown in FIG. 2, and is an axis perpendicular to the plane defined by the X and Y axis. Further, it corresponds substantially to the average direction of propagation of the projection beam. The Rz direction, is conventional notation for denoting a rotational direction around the Z axis. The purging system 10 is further coupled flexibly by a flexible coupling device 16 to the projection system PL in the Z, Rx, and Ry directions, wherein the Rx and Ry directions are shown in FIG. 2 and correspond to the conventional notation for a rotational direction around the X and Y axis, respectively. In an alternative embodiment, the flexible coupling device 16 may be coupled to another component in the lithographic apparatus, such as a reference or metrology frame (not shown).

Further, a coupling device 12, 14 is provided, in an implementation in the form of a gas bearing 12 and optionally, an at least partial vacuum 14 to couple the purge hood 11 to the substrate W, the substrate table WT, or both. As discussed in more detail hereinbelow, in the embodiment shown in FIG. 2, the gas bearing is shown by reference numeral 12 and the vacuum by reference numeral 14. However, depending on the particular embodiment, the respective locations of the gas bearing and vacuum may be exchanged. For example, in an alternative embodiment, by disposing the vacuum on the purge volume 20 side of purge hood 11 and the gas bearing on the ambient environment 25 side of the purge hood 11, purge gas may be reduced or prevented from being released into the ambient environment 25. This is advantageous because it has been found that purge gas released into the environment in the lithographic apparatus may influence measurement systems, for example, the interferometric measuring system IF, shown in FIG. 1. In an embodiment, a vacuum ring is provided to seal the inside edge of the purge hood, the edge that is closest to volume 20. In this way, the purge gas can be removed while preventing or reducing gas from the gas bearing from entering the purge volume 20. Further, an outer vacuum ring may be provided to seal the outer edge of the purge hood from the ambient environment 25. In this way, little or no purge gas or gas from the gas bearing gas may be released into the ambient environment 25, where sensitive components such as the interferometric measuring devices IF are located. Thus, in an embodiment, the vacuum coupling device configured to seal an inner edge of the purge hood and the vacuum coupling device configured to seal an outer edge of the purge hood are arranged and constructed as vacuum rings.

Gas is provided to the coupling device 12, 14 by a gas supply 52 and is removed by an exhaust 53. The coupling device 12, 14 is controlled by a control element 26, typically a regulator. The control element 26 is arranged to control the flow and/or pressure of the gas flow to and, optionally from, the purging system 10. Typically, the control element controls the coupling between the purging system and the substrate table, substrate, support structure, patterning device, or any combination thereof. In an embodiment, the control element is arranged to provide a minimal gas gap between the substrate table WT, substrate W, support structure MT, patterning device MA, or any combination thereof, and the purging system 10, so as to isolate the purge volume from a surrounding environment.

Further, the control element 26 may control the gas bearing 12 to provide a predetermined gas gap between the purging system 10 and the substrate table WT, substrate W, support structure MT, patterning device MA, or any combination thereof, by controlling the gas pressure and/or vacuum provided by the gas bearing to the coupling.

In an embodiment, a purge hood 11 is provided in which an at least partial vacuum or an exhaust is provided on either side of a gas bearing 12, that is, a first exhaust is disposed towards the purge volume 20 side of the purge hood 11, a further exhaust is disposed towards the environment 25 side of the purge hood 11, and a gas bearing 12 is provided between the first exhaust and the second exhaust. In this way, while purge gas may be prevented or reduced from escaping into the environment 25, any gas used for the gas bearing is prevented from coming into contact with one or more optical elements of the projection system. Thus, it may not be necessary to use highly purified gas for the gas bearing 12. Further, environmental influences, such as contaminants, may be prevented or reduced from entering the purge volume 20.

In an embodiment, the coupling device 12, 14 provides a flexible coupling in at least one of the directions Z, Rx and Ry between the purge hood 11 and the substrate W, substrate table WT, or both. By providing such a flexible coupling, any movement of the substrate W or substrate table WT in the Z direction can be followed by the purge hood 11. In other words, the purge hood 11 floats on top of the substrate table WT with sufficient stiffness in the Z-direction, possibly avoiding any damaging collisions with the substrate table WT and, in particular, the substrate W. As described in detail below, a stable gap 22 is provided by using a gas, for example, the purge gas, as a gas bearing between the substrate W and the purge hood 11. In order to increase the rigidity of the flexible coupling 12, 14, an at least partial vacuum 14 may also be provided. In this way, the stability of the coupling may be increased, and a stable gap 22 may be achieved between the purge hood and the substrate W, the substrate table WT, or both, without high design tolerances. The at least partial vacuum 14 may additionally be used to exhaust purge gas when it cannot be released into the environment, for example, because it may influence measurement systems in the lithographic apparatus, for example, the interferometric measuring system IF, shown in FIG. 1.

In FIG. 2, the purge volume 20 is provided in a region in the vicinity of a portion of the projection system PL. The surface 21 of the projection system PL through which the projection beam PB exits the projection system PL is a particular portion of the projection system PL to which a purging gas is provided. In this way, the concentration of possible contaminants in the region of the exit surface 21 of the projection system PL is reduced in order to avoid contamination of the projection system PL. Typically, the free space between the purge hood 11 and the projection system PL is of the order of a few millimeters. As shown in further detail in FIG. 5, the purge gas is injected into the purge hood 11 via a nozzle 52.

Figure 3:
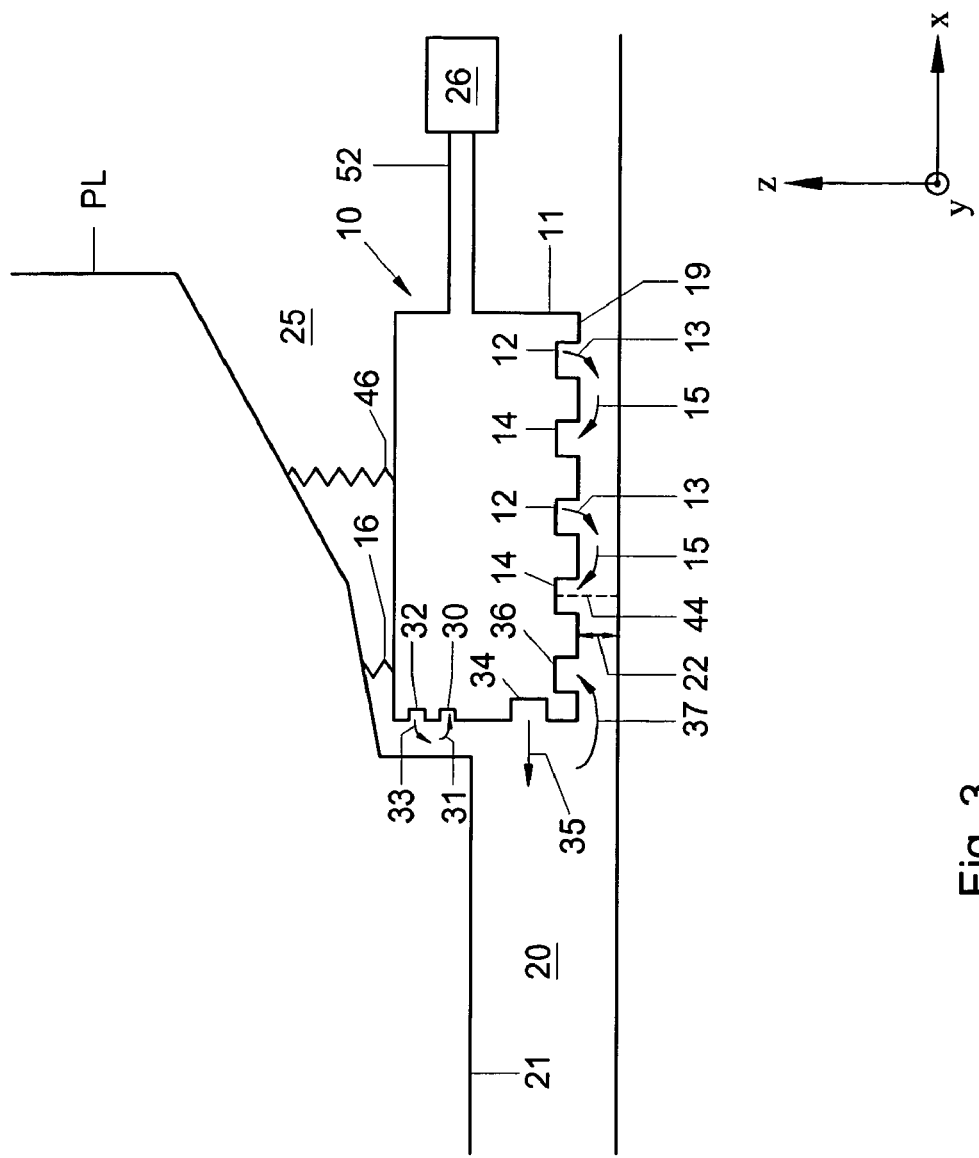
FIG. 3 depicts a lithographic apparatus that includes a gas purging system according to a further embodiment of the invention.

FIG. 3 depicts a lithographic apparatus that includes a gas purging system according to a further embodiment of the invention. In particular, in FIG. 3, the rigid coupling 18 that is shown in FIG. 2 is replaced by a further gas bearing 30, 31, 32, 33. A gas outlet 32 provides a flow of pressurized gas 33 to provide a gas bearing. Further, an at least partial vacuum 30 is provided to exhaust gas 31 to thereby increase the rigidity of the bearing provided by outlet 32. Thus, a rigid gas bearing 30, 31, 32, 33 provides the rigid coupling of the purge hood 11 to the projection system PL in the X, Y and Rz directions. Further, as described in more detail below, it provides a seal between the purge volume 20 and the environment 25. It further provides a seal between the purge volume 20 and the pressurized gas 33. Such an arrangement may be advantageous in an embodiment where the cleanliness of the pressurized gas, for example, clean dry air (CDA), is inferior to that of the purging gas, for example, purified CDA. Thus, in this particular embodiment, the less clean pressurized gas may be prevented or reduced from contaminating the purge volume 20. In an embodiment, the gas may be provided through chamber 30 and exhausted through chamber 32 depending on the particular application and bearing required.

A gas outlet 34 provides a purge gas 35 into the purge volume 20. An at least partial vacuum 36 exhausts the purge gas 37 from the purge volume 20. Whereas in FIG. 2, the gas bearing 12, 14 includes a single gas outlet 12 and at least partial vacuum 14, in the further embodiment shown in FIG. 3, a plurality of gas outlets 12 and at least partial vacuums 14 are provided. In this way, the stability and flexibility of the gas bearing can be further controlled. Further, disturbance of measurement systems, located in the vicinity of the purge hood 11 can be minimized and control of the cleanliness of the gas used to purge volume 20 may be better maintained. In the embodiment shown, gas outlet 12 provides a pressurized gas flow 13 into gap 22, while the adjacent at least partial vacuum gas inlet 14 exhausts 15 at least a portion of the gas flow. Similarly, subsequent gas outlets 12 provide further gas flows and subsequent adjacent at least partial vacuum gas inlets 14 exhaust 15 at least a portion of the gas flow. In the example shown, there are two gas outlets 12 and two gas inlets 14, however, the gas bearing 12, 14 may include one or more gas outlets and/or gas inlets. Location of the outlet(s)/inlet(s) may be optimized so as to prevent or reduce surrounding gas 17 from coming into the purge volume 20 or gas 13 from coming into the purge volume 20 and from being released into the environment where it may influence measurement systems.

The gas bearing 12, 14 may form a seal 44 between the purge volume 20 which is purged by purge gas 35 and the environment 25. Similarly, the gas bearing 30, 31, 32, 33 may also provide a seal between the purge volume 20 and the environment 25. In this way, purge gases that might otherwise not be a viable option because of, for example, their impact on other components in the lithographic apparatus or on the environment in general, may be used as a purge gas, because in accordance with an embodiment of the present invention, the purge volume 20 is sealed 44 to provide a substantially enclosed purging compartment. These purge gases may be, for example, toxic gases or gases that would disturb the performance of the interferometer system IF.

Optionally, as shown in FIG. 3, an extra vacuum chamber 36 is provided to remove most of the purge gases before they enter the gas bearing vacuum inlet 14. Further, the exhausted gases may be recycled.

In an embodiment, instead of using one or two chambers 12, 14 supplied with an over pressure and vacuum, respectively, an arbitrary array of chambers with pressure and vacuum may be used to provide the functions of gas bearing, sealing and adding/removing of purge gas. In an embodiment, the array may be arranged such that the direction of flow is reversed. In particular, so that flow is directed from inside of the purge volume 20 towards the environment 25. In an embodiment, a combination of flow directions may be arranged. In this way, depending on the chosen flow direction, depending on the user's wishes, which may be determined, for example, by the nature of the purging and gas bearing gases, respectively, and the environment, the sealing of gas from the environment going to the purging environment or of gas from the purging environment going to the environment may be controlled effectively.

Chambers may also be replaced by regions of porous material provided in a surface 19 of the purge hood adjacent the substrate W, the substrate table WT, or both to provide a uniform and stable flow of gas. Typically, the flow of gas is also well-mixed. In such a way, the gas bearing can be further regulated and the relative rigidity and/or flexibility of the bearing controlled. In an embodiment, the chambers may be a ring of small holes. Such an arrangement may be suitable for use for pressurized gas. In an embodiment, where the gas bearing 30, 31, 32, 33 is replaced with a rigid coupling 18, as shown in FIG. 2, or to further improve the seal between the purge volume 20 and the environment 25, a flexible seal 46 may also be provided.

Figure 4:
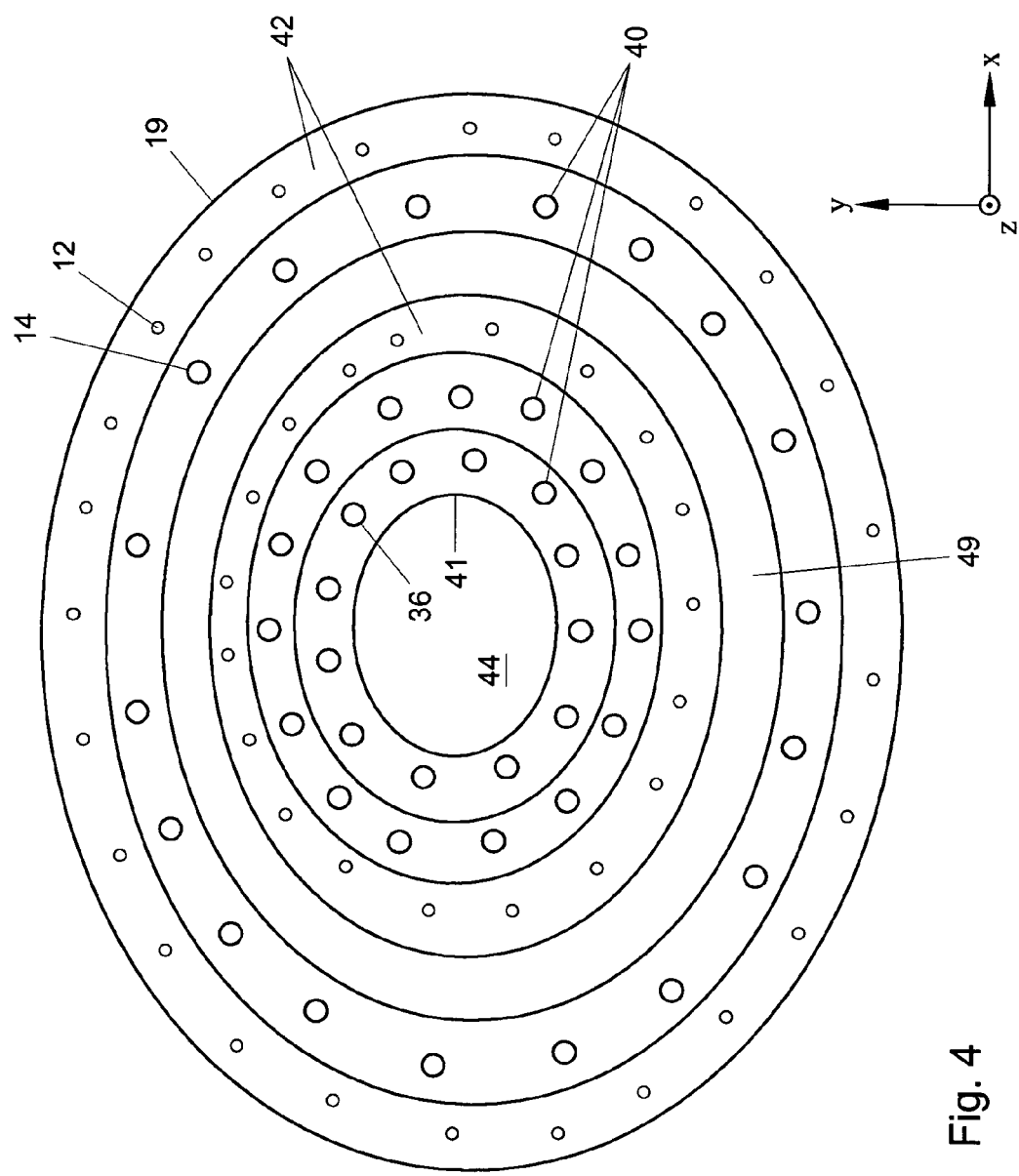
FIG. 4 depicts details of the gas purging system of FIGS. 2 and 3 according to an embodiment of the invention.

FIG. 4 depicts details of the gas purging system according to an embodiment of the invention. In particular, FIG. 4 shows a surface 19 of the purge hood 11 shown in FIG. 2, facing the substrate W, the substrate table WT, or both. In particular, regions 42 are provided in the surface 19 which provide pressurized gas, and regions 40 are provided in the surface which provide at least a partial vacuum. The regions 40, 42, as shown in FIG. 4, may be ring shaped. Thus, vacuum rings and gas supply rings may be provided to seal and couple the purge hood; respectively, at desired locations. As mentioned previously, vacuum rings 40 may be provided to seal an inner and outer edge of the purge hood, respectively. The gas supply rings 42 form a gap between the purge hood and the substrate W, the substrate table WT, or both. The rings may be concentrically arranged. In an embodiment, purge gas is injected into the purge volume 20 and removed via the exhaust and/or vacuum. In a particular embodiment, the inner most vacuum ring 40 is particularly suited as an exhaust for the purge gas. In this way, purge gas is prevented or reduced from escaping into the environment. Further, the performance may be increased because the flow pattern can be controlled depending on the vacuum applied via the vacuum ring.

The regions 42 for providing pressurized gas include a plurality of gas outlets 12, also referred to above as gas chambers 12, through which pressurized gas is supplied. The regions 40 for providing at least a partial vacuum include a plurality of inlets 14, also referred to above as vacuum chambers 14, through which gas is exhausted from the gap 22. Similarly, region 41 corresponds to the purge gas exhaust and includes a plurality of inlets 36, also referred to above as vacuum chambers, through which gas is exhausted from the purge volume 20. As mentioned above, the regions 40, 42 may also or alternatively include regions of porous material. The degree of porosity will depend on the desired gas bearing. For example, the porosity of the pressurized gas supplying regions 42 may be higher than the porosity of the vacuum regions 40. In the embodiment shown, the gas outlets 12 typically have a smaller cross sectional area than the gas inlets 14. In this way, the pressure of the gas supplied can be accurately controlled. Similarly, the distribution of the outlets 12 with respect to the inlets 14 may also vary. For example, a higher density of outlets 12 with respect to inlets 14 may be provided in order to regulate the pressure of the gas supplied by the bearing. In the example shown, the distribution of gas outlets 12 is approximately the same as the distribution of gas inlets 14. The surface 19 of the purge hood 11 adjacent the substrate W, the substrate table WT, or both, is substantially circular in the embodiment shown. However, the shape of the surface 19 may vary in accordance with the design of a particular purge hood 11. Provided in the center of the surface 19 is an aperture 45 through which the projection beam PB passes before becoming incident on the substrate W. In the example shown, the aperture 45 is substantially circular. However, the aperture 45 may have a different shape, for example, in accordance with the projection beam delivered by the projection system PL and the design of the purge hood 11. In FIG. 4, a region 49 between the two chambers is shown. In this region 49, the purge hood 11 and substrate/substrate table are disposed close together with a small gap 19 separating them. In this way, a high flow velocity occurs in this region 49. This high flow velocity region 49 may further improve the sealing effect between the purge hood 11 and the environment 25.

Figure 5:
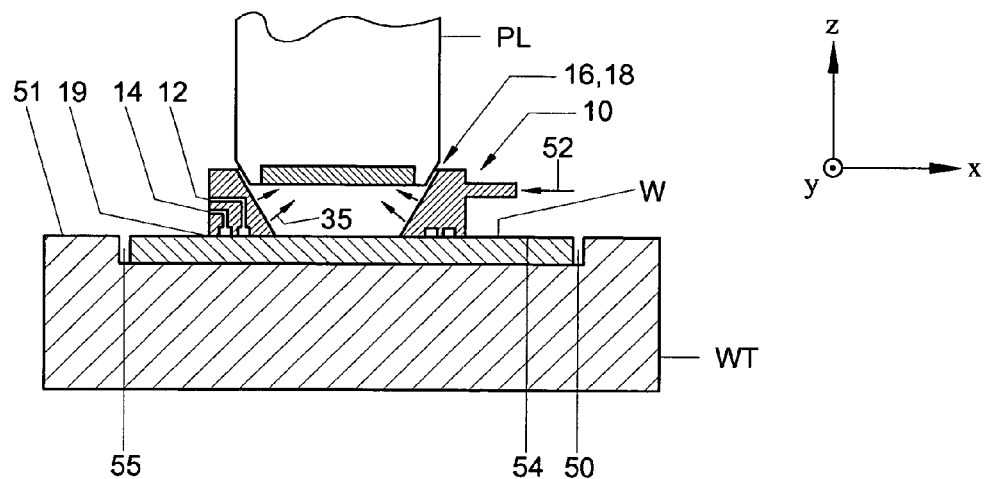
FIG. 5 depicts a lithographic apparatus that includes a gas purging system according to another embodiment of the invention.
Figure 6:
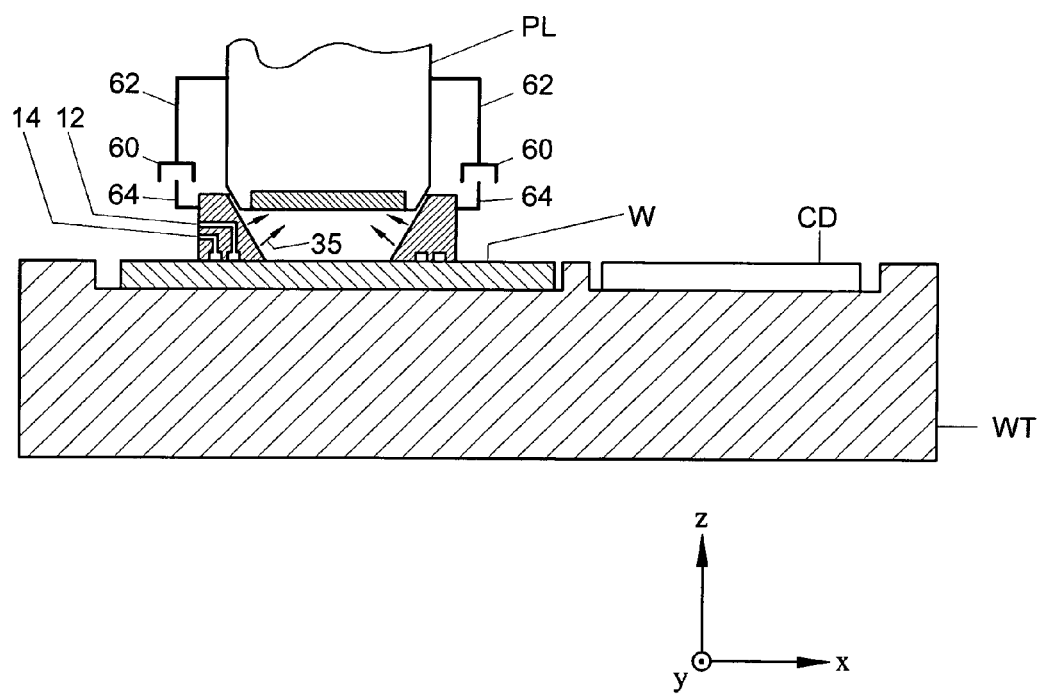
FIG. 6 depicts a lithographic apparatus that includes a gas purging system according to another embodiment of the invention.
Figure 7:
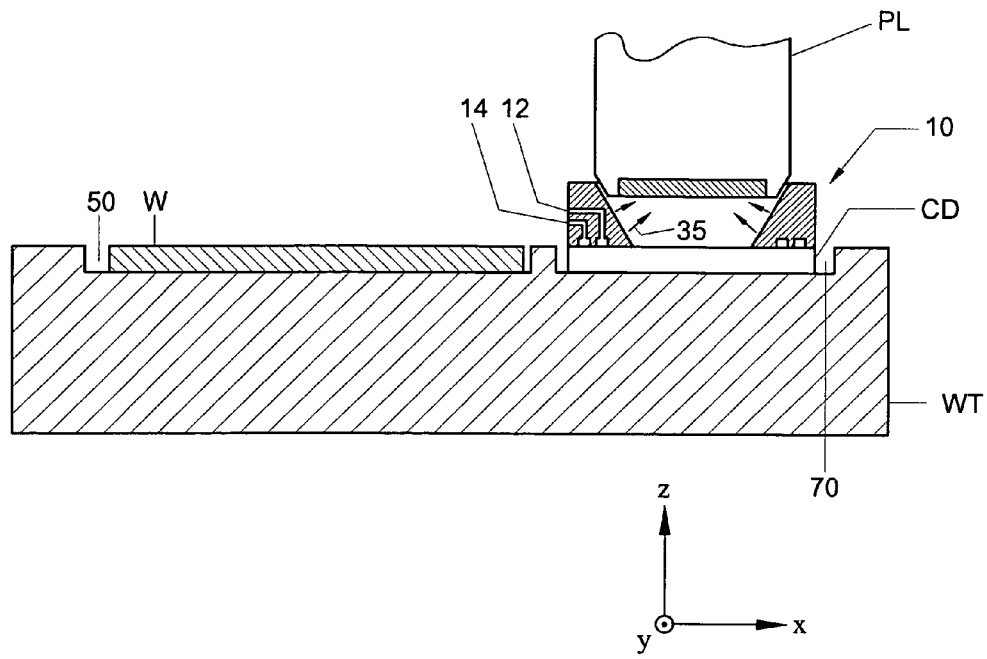
FIG. 7 depicts a lithographic apparatus that includes a gas purging system according to a further embodiment of the invention.

FIGS. 5–8 depict a lithographic apparatus that includes a gas purging system according to further embodiments of the invention. With reference to FIGS. 5–7, during scanning for example, the purge hood 11, while in use, may be disposed so that it is partly adjacent the substrate table WT and partly adjacent the substrate W. In order to address this problem, the surface 51 of the substrate table WT adjacent the purge hood 11 is, in an embodiment, flat. Further, the height of the surface 51 of the substrate table WT is, in an embodiment, substantially flush with the surface 54 of the substrate W when it is adjacent the purge hood 11. That is, the height of the surface of the substrate table WT and the height of the surface of the substrate W are substantially equal. This is achieved in the embodiments shown in FIGS. 5–7 by the provision of a recess 50 arranged to receive the substrate W, disposed in the substrate table WT. The recess 50 has a depth substantially equal to the dimension of the substrate W in the Z direction, that is substantially equal to the thickness of the substrate W. The substrate W is disposed in the recess. While the recess 50 is provided so that substrate W fills a significant proportion of the recess 50, it is not necessary that the substrate fills the recess 50 completely. A gap 55 around the substrate W is permissible in order to allow substrates having different sizes to be accommodated in the same recess 50. A leak may occur between the side of the recess 50 and the substrate or substrate table. Such a leak may cause either the environment atmosphere to enter the purge volume or the purge gas to leak out from the purge volume to the environment, for example, when the purge hood 11 is moving over the edge of the substrate W. This problem may be addressed by providing an array of gas in/outlets around the side of the recess 50, wherein the purge gas may be either blown in or sucked out through the array of in/outlets around the side of the recess 50. Further, FIG. 5 shows a gas supply 52 through which purge gas, gas bearing gas, or both, is provided. In the embodiment shown, both purge and gas bearing gases are provided through the same supply 52.

FIG. 6 shows a further embodiment in which the lithographic apparatus is engaged in a scanning and/or exposing operation. While scanning, the purge hood 11 moves over the substrate W. Once a substrate W has been exposed to radiation, a substrate table WT swap occurs in which the substrate table in which the substrate is disposed is replaced with a further substrate table WT in which a further substrate W is disposed. This procedure is carried out in, for example, a dual stage lithography apparatus. Alternatively, once scanning is completed for a substrate W, it may be removed from recess 50. A subsequent substrate W for scanning, is then subsequently disposed in the recess 50.

Figure 8:
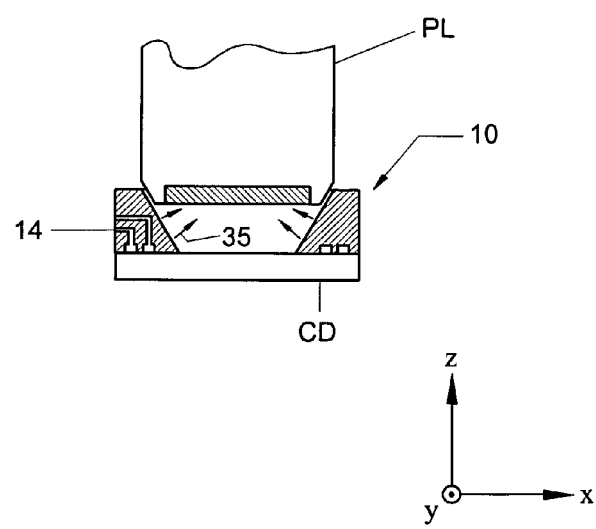
FIG. 8 depicts a lithographic apparatus that includes a gas purging system according to another embodiment of the invention.

In FIGS. 6–8, the example of a substrate table WT swap is shown. In order to swap the substrate tables WT, the vacuum of the purge hood 1I may optionally be removed; this is not necessary, however. As described hereinbelow, for an embodiment where a closing plate is used, the vacuum is typically kept on while the substrate tables WT are swapped. In addition, or alternatively, as shown in FIG. 6, one or more actuators 60 are provided. The actuators 60 are coupled by a coupling device 62 to the projection system PL and by a further coupling device 64 to the purge hood 11. Actuation of the actuators 60 causes the purge hood 11 to be lifted when a substrate table WT exchange is to take place. In an embodiment, an actuator may cause an arrangement of a magnet to selectively lift the purge hood 11 when required so as to allow a substrate table WT or substrate W swap.

FIG. 7 shows the lithographic apparatus engaged in take over, that is, where the substrate table WT is moved with respect to the projection system PL and purging system 10 so as to allow an exchange of the substrate tables WT to take place. In order to protect the projection system PL from contamination during substrate table WT exchange, a closing plate CD is provided to cover the aperture 44 between the purge hood 11 and the projection system PL. In particular, a closing plate is provided in immersion lithography in order to keep the projection system wet during substrate table WT exchange. Using a closing plate, the liquid, for example, water, can be contained or kept flowing during a substrate table WT swap. The closing plate CD is typically provided in a further recess 70 disposed in the substrate table WT. As with the substrate W, the recess 70 has a depth substantially equal to the thickness of the closing plate CD, so that the surface of the substrate table WT is flush with the surface of the closing plate CD when the closing plate CD is disposed, in use, in the recess 70. In an embodiment, once the vacuum has been released in FIG. 6, and optionally, the actuators 60 activated, the substrate table WT is moved with respect to the projection system PL, to which the purging system 10 is coupled, to a position so that the projection system PL is adjacent the closing plate CD disposed in recess 70, as shown in FIG. 7. In an embodiment, it is not necessary to release the vacuum in order to move to the closing plate, nor is it necessary to use actuators to lift the purge hood. In particular, in an embodiment where the closing plate and substrate are arranged to be flush with the substrate table surface, they can be simply moved from one side to another. For picking up the closing plate, the pressurized gas is typically turned off. The vacuum typically remains on, as this clamps the closing plate in position.

Once in position adjacent the closing plate, the at least partial vacuum 14 is actuated so as to cause the closing plate CD to be sucked on to the aperture 44, as shown in FIG. 8. The vacuum is used to lift the disc CD from its storage position in the substrate table WT and keep it fixed to the purge hood 11. Once closed, the substrate table WT is removed, as shown in FIG. 8. Subsequently, another substrate table WT is provided. The closing plate CD closes the purge hood 11 and thus guarantees a high dilution factor when no substrate table WT is present. This is useful to keep the projection system clean and/or dry during substrate table WT or substrate W swap.

While the invention is not limited with respect to the purge gas used, in all the embodiments described above, the purge gas may, for example, include very pure nitrogen N2, or a gas selected from the group He, Ne, Ar, Kr and Xe, or a mixture of two or more of any of these gases. The gas composition used is one which is substantially transparent to UV radiation of the wavelength of the projection beam and, in an embodiment, has a refractive index which is substantially the same as that of air, when measured under the same conditions of temperature and pressure (for example, standard clean room conditions) and using radiation of the same wavelength. In an embodiment, the refractive index is the same as that of air at the wavelength of a radiation beam used in an interferometric displacement measuring device IF (shown in FIG. 1). The pressure of the purge gas in the mask and/or substrate stages may be atmospheric pressure, or it may be above atmospheric pressure so that any leak results in an outflow of gas rather than contaminating the system with incoming air. Mixtures of gases include, but are not limited to, air, filtered air, compressed filtered air, nitrogen, and purified CDA.

The composition of the gas or gases used in the gas bearing may be the same as or of a similar nature to those of the purging gases. There is no requirement that the gas bearing use the same gas composition. However, the gas supply for the purging gas and gas bearing gas is simplified if the same gas is used because no separate gas supply for the purge gas and gas bearing gas may be required. In particular, any kind of gas may be used for the gas bearing, for example, nitrogen, compressed air, or filtered compressed air. The pressure at which the gas is supplied will depend on the desired dimension of the gap 22, the mass of the purging system, in particular, the purge hood, and the area of the gas outlets. The gas pressure may typically be in the region of 6 bar or less. If other factors are kept substantially constant, the higher the pressure of the gas delivered through the gas bearing outlets, the greater the dimension of the gap 22. A regulator is provided to regulate the gas flow through the gas bearing to maintain a gap 22 of sufficiently accurate dimensions. In this way, the gas bearing provides a flexible coupling. In an embodiment, the gas volume in front of the gas outlets is increased to ensure an equal distribution of pressure at each gas outlet to obtain a more stable bearing. The dimension of the gap 22 is typically less than around 100 micrometers. A typical dimension for the gap in the Z direction in non-immersion lithography is in the range of 30–200 micrometers. In immersion lithography, a typical dimension of the gap 22 in the Z direction is in the range of 30 micrometers. In particular, between around 10 to 50 micrometers. However, using the regulator, the dimension of the gap can be varied in accordance with desired operating conditions, which, for example, may be determined by the surface flatness of the substrate either within one substrate or between different substrates having differing thicknesses. The typical dimension of the gap in a conventional air bearing is of the order 8–15 microns.

In the embodiments where at least a partial vacuum is provided in addition to the pressurized gas in the gas bearing 12, 14, for a gas pressure of approximately 6 bar, a vacuum in the approximate range of −0.4−−0.8 bar is provided. It will be understood that the vacuum required will depend on the gas bearing desired with respect to a particular purge hood 11 and the gap 22 to be maintained between the purge hood and the substrate table WT, the substrate W, or both.

In the embodiments shown in the Figures, a purging system for use in the vicinity of the substrate stage is shown and described. However, in addition, embodiments of the present invention have application to the reticle stage MT, that is, to the support structure MT for the patterning device MA. Thus, in a further embodiment, a gas purging system 10 is provided for providing a gas to a purge volume 20, the purge volume 20 including at least a portion of the illumination system IL. A coupling device may be provided for coupling the purging system 10 to the support structure MT and/or the patterning device MA. In this way, the benefits described with relation to the substrate stage may be also shared by the mask stage MT.

In an embodiment, the support structure MT and/or patterning device MA is disposed in a zone defined by a first and a second different direction. The purging system 10 is coupled to the support structure MT and/or patterning device MA in a third direction which extends at an angle to the zone. In an embodiment, the purging system is flexibly coupled to the support structure MT and/or patterning device MA in the third direction, a rotational direction around the first direction, a rotational direction around the second direction, or in any combination thereof. In an embodiment, the purging system 10 is rigidly coupled to the illumination system IL in the first direction, the second direction, a rotational direction around the third direction, or any combination thereof.

In an embodiment, the support structure MT is provided with a recess arranged to receive the patterning device, wherein, for example, the recess has a depth substantially equal to the thickness of the patterning device. In an embodiment, the recess has an: edge extending around a periphery of the recess, and the apparatus further includes an array of gas inlets and/or gas outlets provided around the edge of the recess to prevent gas leaking either to or from a purge volume when the purge hood moves over an edge of the patterning device. In an embodiment, a surface of the patterning device MA arranged to receive the projection beam is substantially flush with a surface of the support structure MT. In an embodiment, the gas bearing, in use, provides a stable gap between a surface of the patterning device arranged to receive the projection beam and the purging system. In an embodiment, the gas bearing includes a control element, typically a regulator, for regulating the flow and/or pressure of gas, to control the dimension of a gap between a surface of the patterning device arranged to receive the projection beam and the purging system. In particular, the gas bearing includes a gas supply for supplying gas to the coupling, at least a partial vacuum for removing gas from the coupling, and a control element which is arranged to control the gas supply and the at least partial vacuum in conjunction, so that the purging system floats on a surface of the patterning device, the support structure, or both, with sufficient stiffness in a third direction lying at an angle to the zone defined by a first and second direction in which the support structure is disposed.

In an embodiment, the purging system includes a purge hood and the purge hood is coupled to the support structure and/or the patterning device. In an embodiment, the purging system includes a purge hood, and the gas bearing includes an actuator arranged to lift the purge hood in a third direction, wherein the third direction extends in a direction at an angle to a zone in which the support structure is disposed. The apparatus may further include an actuator arranged in conjunction with the coupling device, to cause the purge hood to be lifted in a third direction, wherein the third direction extends in a direction at an angle to a zone in which the support structure is disposed. The actuator may cause a magnet or magnets to lift the purge hood 11. A control element may also be provided for controlling the coupling between the purging system and the support structure and/or patterning device. In particular, the coupling device may include a gas bearing and a control element arranged to provide a minimal gas gap between the support structure and/or the patterning device and the purging system, so as to isolate the purge volume from a surrounding environment.

While specific embodiments of the invention have been described above, it will be appreciated that the invention may be practiced otherwise than as described. The description is not intended to limit the invention.

What is claimed is:

1. A lithographic apparatus comprising:
   an illumination system configured to condition a beam of radiation;
   a support structure configured to hold a patterning device, the patterning device serving to impart the beam of radiation with a pattern in its cross-section;
   a substrate table configured to hold a substrate;
   a projection system configured to project the patterned beam onto a target portion of the substrate;
   a fluid supply system configured to provide a fluid to a volume, the volume comprising at least a portion of the projection system, at least a portion of the illumination system, or both; and
   a coupling device configured to couple the fluid supply system to the substrate table, substrate, support structure, patterning device, or any combination thereof.

2. An apparatus according to claim 1, wherein the fluid supply system comprises a gas purging system configured to provide a gas to a purge volume, the purge volume comprising a portion of the projection system, at least a portion of the illumination system, or both.

3. An apparatus according to claim 2, wherein the purging system comprises a purge hood which, in use, is coupled to the substrate table, the substrate, the support structure, the patterning device, or any combination thereof.

4. An apparatus according to claim 2, wherein the purging system comprises a purge hood, and the apparatus further comprises an actuator arranged in conjunction with the coupling device, to cause the purge hood to be lifted in a third direction, the third direction extending in a direction at an angle to a zone in which the substrate table, the support structure, or both is disposed.

5. An apparatus according to claim 4, wherein the actuator causes a magnet to lift the purge hood.

6. An apparatus according to claim 2, wherein the purging system comprises a purge hood, and wherein the coupling device is arranged to couple the purge hood, when in use, with respect to the substrate table, or the support structure, so that a movement of the substrate table and substrate, or support structure and patterning device, respectively, in a third direction which extends at an angle to the zone in which the substrate table and support structure are disposed, respectively, is followed by the purge hood.

7. An apparatus according to claim 2, wherein the purging gas is used as a gas in a gas bearing of the coupling device or vice versa.

8. An apparatus according to claim 2, wherein the gas purging system comprises a seal member configured to isolate the interior of the purge volume from the environment outside the purge volume.

9. An apparatus according to claim 1, wherein the fluid supply system comprises a liquid supply system configured to provide a liquid to a space between the projection system and a localized area of the substrate.

10. An apparatus according to claim 9, wherein the liquid supply system comprises a seal member configured to at least reduce leakage of the liquid from under the projection system.

11. An apparatus according to claim 10, wherein the seal member is coupled to the substrate table, substrate, support structure, patterning device, or any combination thereof.

12. An apparatus according to claim 1, wherein, in use, the substrate table, substrate, support structure, patterning device, or any combination thereof is disposed in a zone defined by a first direction and a second different direction, and wherein the fluid supply system is coupled to the substrate table, substrate, support structure, patterning device, or any combination thereof in a third direction which extends at an angle to the zone.

13. An apparatus according to claim 12, wherein the first, second, and third directions are substantially mutually perpendicular.

14. An apparatus according to claim 12, wherein the fluid supply system, in use, is flexibly coupled to the substrate table, substrate, support structure, patterning device, or any combination thereof in the third direction, a rotational direction around the first direction, and a rotational direction around the second direction.

15. An apparatus according to claim 12, wherein the fluid supply system, in use, is rigidly coupled to the projection system, the illumination system, a reference frame, or any combination thereof in the first direction, the second direction, and a rotational direction around the third direction.

16. An apparatus according to claim 12, wherein the first, second and third directions correspond to an X, Y and Z, direction respectively.

17. An apparatus according to claim 16, wherein the fluid supply system comprises a gas purging system configured to provide a gas to a purge volume, the purge volume comprising at least a portion of the projection system, at least a portion of the illumination system, or both wherein the purging system includes a purge hood and the position of the purge hood in the X and Y directions and their respective rotational directions is determined by rigidly coupling the purge hood to the projection system, a reference frame, or both while the coupling of the purge hood, in use, to the substrate, the substrate table, the support structure, the patterning device, or any combination thereof in the Z direction is flexible.

18. An apparatus according to claim 16, wherein the Y direction is a scanning direction, the X direction and Y direction define a plane in which the substrate table, the substrate, the support structure, the patterning device, or any combination thereof are disposed, in use, and the Z direction extends in a direction substantially perpendicular to the plane.

19. An apparatus according to claim 1, wherein the coupling device comprises a gas bearing.

20. An apparatus according to claim 19, wherein the gas bearing is configured to provide a seal to at least reduce fluid from escaping from the fluid supply system.

21. An apparatus according to claim 19, wherein the gas bearing is configured to provide a substantially enclosed fluid compartment.

22. An apparatus according to claim 19, wherein the gas bearing, in use, provides at least one of a stable and small gap between a surface of the substrate arranged to receive the patterned beam and the fluid supply system.

23. An apparatus according to claim 19, wherein the gas bearing, in use, provides at least one of a stable and small gap between a surface of the patterning device arranged to receive the beam of radiation and the fluid supply system.

24. An apparatus according to claim 19, wherein the gas bearing comprises a control element configured to regulate the flow and/or pressure of gas to control the dimension of a gap between a surface of the substrate arranged to receive the patterned beam and the fluid supply system.

25. An apparatus according to claim 19, wherein the gas bearing comprises a control element configured to regulate the flow and/or pressure of gas to control the dimension of a gap between a surface of the patterning device arranged to receive the beam of radiation and the fluid supply system.

26. An apparatus according to claim 19, further comprising a gas supply configured to supply gas to the gas bearing, at least a partial vacuum configured to remove gas from the gas bearing, and a control element configured to control the gas supply and the at least partial vacuum in conjunction, so that the fluid supply system floats on a surface of the substrate, the substrate table, or both with sufficient stiffness in a third direction extending at an angle to a zone defined by a first and second direction in which the substrate table is disposed.

27. An apparatus according to claim 19, further comprising a gas supply configured to supply gas to the gas bearing, at least a partial vacuum configured to remove gas from the gas bearing, and a control element configured to control the gas supply and the at least partial vacuum in conjunction, so that the fluid supply system floats on a surface of the patterning device, the support structure, or both with sufficient stiffness in a third direction extending at an angle to a zone defined by a first and second direction in which the support structure is disposed.

28. An apparatus according to claim 19, wherein the fluid supply system comprises a gas purging system configured to provide a gas to a purge volume, the purge volume comprising at least a portion of the projection system, at least a portion of the illumination, or both wherein the purging system comprises a purge hood, and comprising an actuator arranged to lift the purge hood in a third direction, the third direction extending in a direction at an angle to a zone in which the substrate table, the support structure, or both is disposed.

29. An apparatus according to claim 28, wherein the actuator is configured to lift the purge hood, in use, when the substrate table is exchanged with a second substrate table.

30. An apparatus according to claim 19, wherein the gas bearing comprises a gas outlet by which pressurized gas can be provided to a coupling region.

31. An apparatus according to claim 19, wherein the gas bearing comprises a partial vacuum by which the pressurized gas can be removed from the coupling region.

32. An apparatus according to claim 19, comprising a control element configured to control the gas bearing between the fluid supply system and the substrate table, substrate, support structure, patterning device or any combination thereof.

33. An apparatus according to claim 32, wherein the control element is configured to control the gas bearing to provide a predetermined gas gap between the fluid supply system and the substrate table, substrate, support structure, patterning device, or any combination thereof by controlling the pressure, vacuum, or both provided by the gas bearing to the coupling.

34. An apparatus according to claim 32, wherein the control element is configured to provide a minimal gas gap between the substrate table, substrate, support structure, patterning device, or any combination thereof and the fluid supply system so as to isolate the volume from a surrounding environment.

35. An apparatus according to claim 1, wherein the substrate table, the support structure, or both, is provided with a recess configured to receive the substrate and patterning device, respectively.

36. An apparatus according to claim 35, wherein the recess has a depth substantially equal to the thickness of the substrate and/or patterning device, respectively.

37. An apparatus according to claim 35, wherein the recess has an edge extending around a periphery of the recess, the apparatus further comprising an array of gas inlets and/or gas outlets provided around the edge of the recess to at least reduce fluid leaking either to or from the volume when the fluid supply system moves over an edge of the substrate and/or patterning device, respectively.

38. An apparatus according to claim 35, wherein, in use, a surface of the substrate arranged to receive the patterned beam is substantially flush with a surface of the substrate table.

39. An apparatus according to claim 35, wherein, in use, a surface of the patterning device arranged to receive the beam of radiation is substantially flush with a surface of the support structure.

40. A device manufacturing method comprising:
projecting a patterned beam of radiation onto a target portion of a substrate using a projection system of a lithographic apparatus;
providing a fluid to a volume using a fluid supply system, the volume comprising at least a portion of the projection system, at least a portion of a illumination system, or both; and
coupling the fluid supply system to the substrate, a substrate table holding the substrate, a patterning device used to form the patterned beam, a support structure holding the patterning device, or any combination thereof.

* * * * *